(12) United States Patent
Chan et al.

(10) Patent No.: US 8,141,612 B2
(45) Date of Patent: Mar. 27, 2012

(54) DEVICE FOR THIN DIE DETACHMENT AND PICK-UP

(75) Inventors: Man Wai Chan, Kwai Chung (HK);
Yuk Cheung Au, Kwai Chung (HK);
Kwok Wai Wong, Kwai Chung (HK);
Chi Ming Chong, Kwai Chung (HK)

(73) Assignee: ASM Assembly Automation Ltd, Hong Kong (HK)

( * ) Notice: Subject to any disclaimer, the term of this patent is extended or adjusted under 35 U.S.C. 154(b) by 321 days.

(21) Appl. No.: 12/417,222

(22) Filed: Apr. 2, 2009

(65) Prior Publication Data

US 2010/0252205 A1 Oct. 7, 2010

(51) Int. Cl.
*B32B 38/10* (2006.01)

(52) U.S. Cl. ........ 156/765; 156/707; 156/714; 156/758; 156/764; 156/766; 156/931; 156/932; 156/941; 156/943

(58) Field of Classification Search .................. 156/707, 156/714, 758, 764, 765, 766, 931, 932, 941, 156/943
See application file for complete search history.

(56) References Cited

U.S. PATENT DOCUMENTS

| | | | | |
|---|---|---|---|---|
| 6,165,310 A * | 12/2000 | Freund et al. | ............ | 156/344 |
| 6,709,543 B2 * | 3/2004 | Kurosawa | ............ | 156/344 |
| 6,824,643 B2 * | 11/2004 | Yoshimoto et al. | ............ | 156/344 |
| 7,240,422 B2 * | 7/2007 | Cheung et al. | ............ | 29/762 |
| 2002/0129899 A1 | 9/2002 | Mimata et al. | | |
| 2003/0077854 A1 * | 4/2003 | Teshirogi et al. | ............ | 438/113 |
| 2007/0228539 A1 | 10/2007 | Medding et al. | | |
| 2007/0293022 A1 | 12/2007 | Ko et al. | ............ | 438/464 |
| 2008/0092360 A1 | 4/2008 | Lee et al. | | |

FOREIGN PATENT DOCUMENTS

KR 10-2007-0120319 12/2007

OTHER PUBLICATIONS

Korean Examination Report mailed May 31, 2011 in corresponding Korean Application No. 10-2010-0029704, along with an English-language translation thereof.

* cited by examiner

*Primary Examiner* — Mark A Osele
*Assistant Examiner* — Nickolas Harm
(74) *Attorney, Agent, or Firm* — Ostrolenk Faber LLP

(57) ABSTRACT

A die detachment device for delaminating a die which is mounted at a position on an adhesive film comprises a plurality of movable plates having quadrilateral-shaped contact surfaces which are arranged adjacent to one another. The plurality of movable plates comprises an intermediate movable plate and outer movable plates on opposite sides of the intermediate movable plate. The contact surfaces of the movable plates together form a combined contact surface for supporting the adhesive film at the position of the die, each movable plate being movable relative to the other movable plates towards and away from the die.

16 Claims, 7 Drawing Sheets

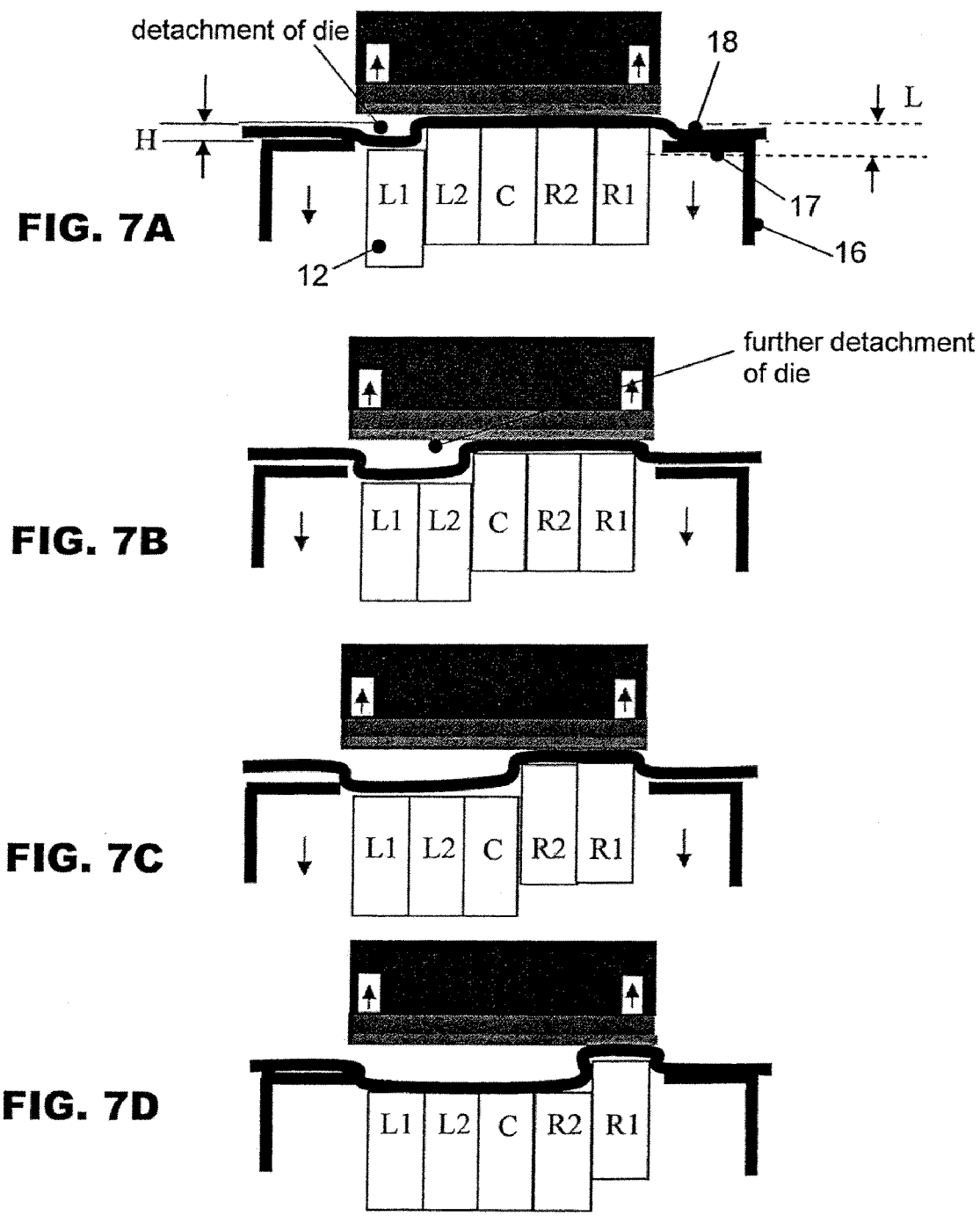

DEVICE FOR THIN DIE DETACHMENT AND PICK-UP

FIELD OF THE INVENTION

The invention relates to the handling of a semiconductor chip or semiconductor die during semiconductor assembly and packaging, and in particular to the detachment and pick-up of a thin semiconductor die from an adhesive film on which it is mounted.

BACKGROUND AND PRIOR ART

Typically, a wafer comprising a plurality of semiconductor dice are mounted on an adhesive film during singulation wherein each individual die is separated while it adheres to the adhesive film. Detaching and picking up of a die from an adhesive film is thus a common process involved in die bonding and flip chip bonding processes for assembling an electronic package. One trend for the development of high density electronic devices is to multiply its density on the same footprint by stacking up the dice comprised in an electronic package. The thickness of each die being stacked in the package has to be reduced in order to minimize the final height of the package.

It becomes a challenging task to detach a die from an adhesive film without damaging the die when the thickness of the die is reduced to below 4 mils (about 100 microns). Dice with thicknesses of 3-4 mils (75-100 microns) have been used for mass production for some time. Mass production of dice at 2-3 mils (50-75 microns) thick is currently under preparation. Experiments for research and development in electronic packaging designs are ongoing for dice of 0.8-2 mils (20-50 microns) thick. Hence, an apparatus that is capable of reliably detaching very thin dice from adhesive films is becoming a critical machine in the realm of electronic assembly equipment.

Typically in a die bonding process, a die is detached and picked up from an adhesive or dicing film by ejecting and pick-up tools before the die is transferred to a substrate such as a lead frame, a printed wiring board (PWB) substrate or a surface of another die in stacking die applications. In a die pickup process, a designated die on a dicing film is aligned with an ejecting tool with push-up pins which raises the die from the underside while the dicing film is held down by vacuum suction. A collet or a pick-up tool is then positioned just above the top surface of the partially detached die while the die is being lifted from the dicing film when the push-up pins rise to an appropriate level. The collet provides vacuum suction to hold the die during the detachment process, as well as transfers the detached die from the dicing film to a bonding substrate.

There are various forms of die detachment and pick up tools for facilitating detachment of a die from a dicing film to which it is mounted. The conventional tools include a needle-type ejector pin design, which is a traditional design for detaching a small die from a dicing film. Other forms of detachment tools are pyramidal-type detachment tools and slide-type detachment tools.

FIG. 1 is an illustration of a conventional die detachment and pick-up tool 100 with needle-type ejector pins 102. The die detachment part of the tool 100 has an ejector comprising an ejector chuck 104, ejector pins 102 and an ejector cap 106. The pick-up part of the tool 100 has a collet 108 mounted on a collet body 109 and positioned above a die 110 located on a dicing film 112 which is in contact with an upper platform surface 107 of the ejector cap 106. Vertical movement of the ejector chuck 104 is driven by a motorised mechanism. The ejector pins 102 are positioned on top of the ejector chuck 104 and are movable with the ejector chuck 104. For small dice of dimensions such as 2×2 $mm^2$, a single ejector pin 102 positioned at the center of the die 110 to be detached suffices to detach the die 110. Multiple ejector pins 102 are preferred for larger dice, and the ejector pins 102 are evenly distributed to achieve a uniform push-up force on the die 110 so as to reduce a pinching effect by the ejector pins 102.

The ejector chuck 104 and ejector pin/pins 102 are positioned within the ejector cap 106. A vacuum channel 114 is enclosed by the ejector cap 106 in order to provide vacuum suction for aiding in the delamination of the die 110 from the dicing film 112.

When the thickness of a die is reduced to less than 100 microns, the die becomes less rigid. To detach a die, peeling energy is applied to the die being detached via push-up motion of ejector pins and the vacuum suction on the dicing film in order to overcome a critical interfacial adhesion strength between the die and a dicing film. Deformation of the die may arise due to the pinching effect by the ejector pins and the bending of the die. When the applied peeling energy reaches the critical interfacial adhesion strength, the die may be detached from the dicing film. However, the die will crack or break when the process of deformation of the die also reaches the critical strength of the die. The critical strength of the die depends on various characteristics of the die, such as the material of the die, wafer thinning, pattern on the surface of die and sawing of the die. For conventional die pick-up using ejector pin or pins, the pinching effect and bending deformation are affected by the number, arrangement and geometry of the ejector pins. Furthermore, for a large die, the ejector pins located at the periphery of the die inhibit propagation of the detachment to the center of die. Therefore, a conventional pick-up tool using ejector pins may not be suitable for detaching a thin die from a dicing film.

The pyramidal-type detachment tool includes a plurality of annular connection members to detach a semiconductor chip from a dicing film by stages; from an outer circumferential portion of the semiconductor chip towards a central portion of the semiconductor chip. The annular connection members are sequentially raised commencing from an outer connection member to a central connection member to form a pyramidal shape. Like the conventional needle-type detachment tool, the raised annular connection members in a pyramidal shape apply stress to the semiconductor chip which may crack or damage as a result of the stress. For this reason, it may also be undesirable to apply the pyramidal-type pickup apparatus for the separation of a thin semiconductor chip from a dicing film.

The slide-type detachment tool includes a slide that moves from side to side and attracts a semiconductor chip by vacuum suction so that the semiconductor chip is separated from a dicing film. Since the slide forms a vacuum while the slide moves from side to side, the distance through which the slide is configured to move increases when the size of the semiconductor chip increases. Also, productivity is low when using the slide-type pickup detachment tool due to the low moving speed of the slide.

Examples of prior art for thin die detachment applications are highlighted as follows. US Publication Number 2007/0228539A1 entitled "Method For Detaching A Semiconductor Chip From A Foil And Device For Mounting Semiconductor Chips" discloses a method for detaching a chip from a dicing film such as a foil using a ramping surface with a stripping edge and ejector pins. The stripping edge is next to a groove area with the ejector pins. When detaching a die, the stripping edge moves up the surface of an ejector cap while vacuum suction is applied to the said ejector cap. The detached semiconductor is curved to form a concave shape when it is transported to the stripping edge by the movement of a wafer table. The detached chip is pushed to the groove and is picked up by ejector pins. A disadvantage of this detachment tool is having to move the wafer table to the stripping edge. In order to move the wafer table, vacuum suction force that is applied between the dicing film and the surface of the ejector cap must be low as the vacuum suction force would drag and distort the wafer. A lower vacuum suction however reduces the applied peeling energy. Furthermore as the detachment of the die is not on a controllable stage, the die may flip. Also, in the final pick-up stage, ejector pins are used which as discussed above are not suitable for picking up thin die.

US Publication Number 2002/0129899A1 entitled "Die Pickup Method And Die Pickup Apparatus" discloses a movable plate which may move horizontally or in both a horizontal plane and a vertical direction to detach a die from a dicing film. The shortcoming for this method is that there is no supporting structure underneath the die being picked when the movable plate is moved to detach the die. This may cause the die to crack at locations where the die is not detached. Additionally, neighbouring dice surrounding the die being picked are affected by the movable plate.

US Publication Number 2008/0092360A1 entitled "Thin Semiconductor Chip Pickup Apparatus and Method" discloses a die detachment apparatus with a stage for supporting a dicing film. An advantage over the movable plate discussed above is that the die detachment process is faster and the neighbouring dice are also not affected by the detachment process. However, this apparatus involves the motion of a suction member along a vertical axis at a level below the surface of the ejector cap which means the die is not pushed up very much away from the ejector cap. Furthermore, the initial detachment requires a dicing film to conform to the initial lowering of the suction member by applying suction vacuum. This greatly limits the applied peeling energy to the die being detached. Therefore, it would be desirable to achieve an effective method of detaching thin chips which provides support to the chip and reduces the pinching effect on the chip while avoiding the disadvantages of the prior art as discussed above.

SUMMARY OF THE INVENTION

It is thus an object of the invention to seek to provide an improved apparatus and method for separating a thin semiconductor chip from a dicing film by reducing stress to the thin semiconductor chip when detaching the same.

Accordingly, the invention provides a die detachment device for delaminating a die which is mounted at a position on an adhesive film, comprising: a plurality of movable plates having quadrilateral-shaped contact surfaces which are arranged adjacent to one another, the movable plates further comprising an intermediate movable plate and outer movable plates on opposite sides of the intermediate movable plate; wherein the contact surfaces of the movable plates together form a combined contact surface for supporting the adhesive film at the position of the die, each movable plate being movable relative to the other movable plates towards and away from the die.

It would be convenient hereinafter to describe the invention in greater detail by reference to the accompanying drawings which illustrate one preferred embodiment of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiments of the invention when considered with the accompanying drawings, in which:

FIGS. 7A to 7F illustrate a second method of delaminating a die with the die detachment and pick-up tool.

DETAILED DESCRIPTION OF THE PREFERRED EMBODIMENT OF THE INVENTION

The preferred embodiments of the invention will hereinafter be described with reference to the accompanying drawings.

Figure 1:
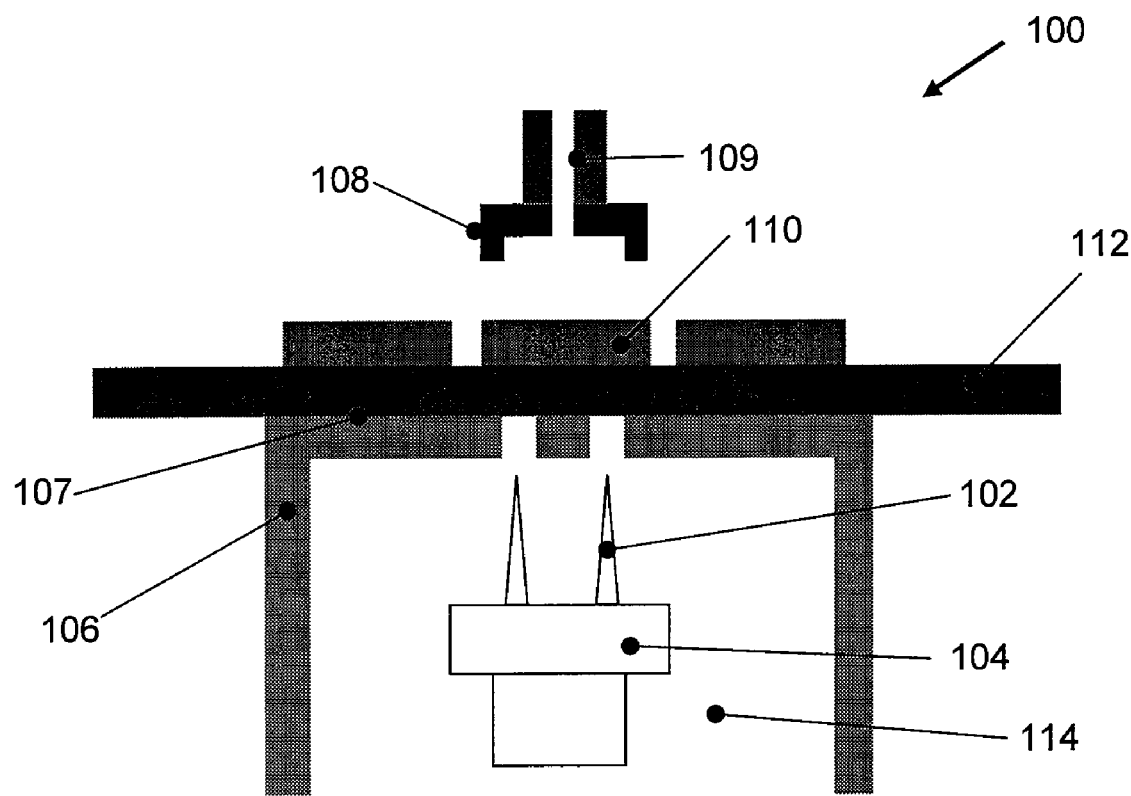
FIG. 1 is an illustration of a conventional die detachment and pick-up tool with needle-type ejector pins.
Figure 2:
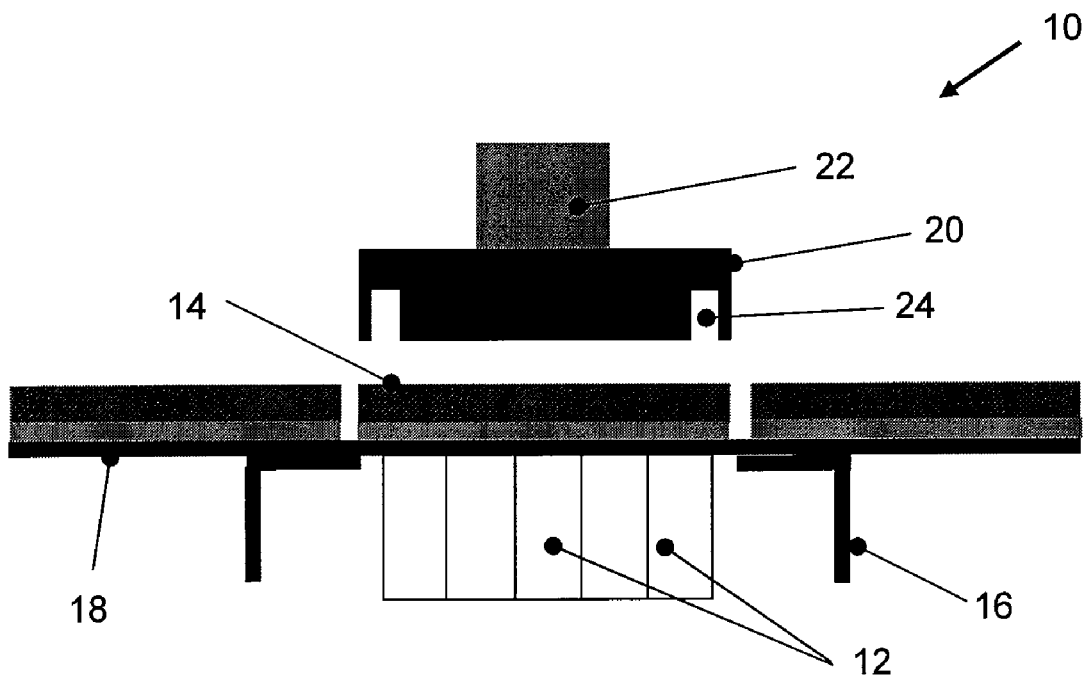
FIG. 2 is an illustration of a die detachment and pick-up tool according to the first preferred embodiment of the invention.

FIG. 2 is an illustration of a die detachment and pick-up tool 10 according to the preferred embodiment of the invention. A movable supporting plate unit 12 for delaminating a relatively thin die 14 is centrally located within an ejector cap 16. The movable supporting plate unit 12 comprises an intermediate movable supporting plate 13 and a plurality of outer movable supporting plates 11 on opposite sides of the intermediate movable plate 13. Each movable supporting plate 11, 13 may be of substantially the same dimensions as the other movable supporting plates. Each of these plates has a quadrilateral-shaped upper contact surface which is in the shape of a rectangle or square.

Figure 3:
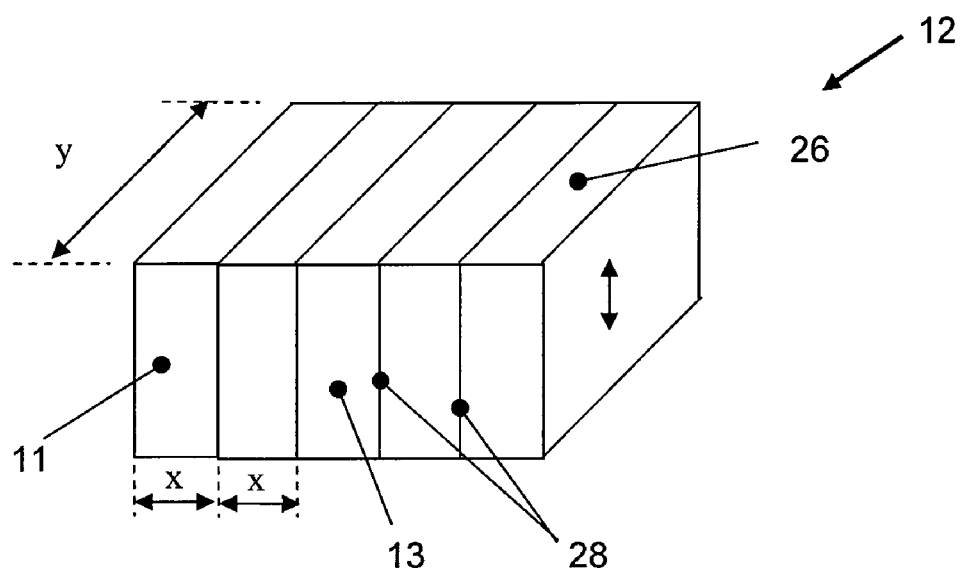
FIG. 3 is an isometric view of a movable supporting plate unit of the die detachment and pick-up tool of FIG. 2.

The movable supporting plates of the movable supporting plate unit 12 are arranged adjacent to one another such that the top surfaces of the movable supporting plates form a combined contact surface 26 which is continuous and flat (see FIG. 3). This combined contact surface 26 is in contact with an adhesive dicing film 18 at the position of the die 14 during the initial detachment of the die 14, which provides maximum support to the die 14 such that the die 14 may avoid substantial deformation while being detached from the dicing film 18. A collet 20 which is connected to a bondhead 22 is positioned above the die 14 being detached. The collet 20 provides vacuum suction via vacuum holes 24 located in the collet 20 and holds the die 14 in place while it is being detached, before picking up and transporting the detached die 14 away from the dicing film 18.

FIG. 3 is an isometric view of a movable supporting plate unit 12 of the die detachment and pick-up tool 10 of FIG. 2. There are preferably an odd number of movable supporting plates 11, 13, with an equal number of outer movable supporting plates 11 on opposite sides of the intermediate movable supporting plate 13. Two pairs of outer movable supporting plates 11 are present in the illustrated arrangement. Each movable supporting plate 11, 13 has a dimension of width x and length y where x is in the range of 0.8 mm to 1.2 mm and y is 0.6 mm to 1.6 mm less than the length of a die. Motors drive the movable supporting plates 11, 13 to move independently of one another in an upwards or a downwards direction towards and away from the die 14. Adjacent movable supporting plates 11, 13 are arranged close to one another to meet at interfaces 28 such that there are substantially no gaps in between the plates so as to form a continuous and flat combined contact surface 26 which does not have any gaps, for supporting the dicing film 18.

Figure 4:
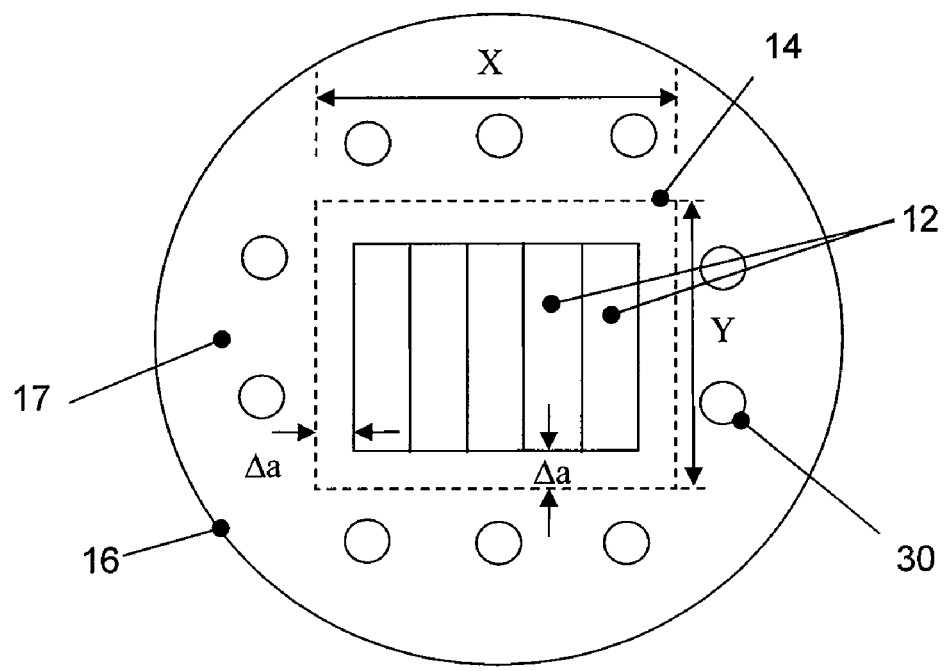
FIG. 4 is a plan view of the movable supporting plate unit of FIG. 2.

FIG. 4 is a plan view of the movable supporting plate unit 12 of FIG. 2. The movable supporting plates 11, 13 are located within the ejector cap 16 of the die detachment and pick-up tool 10 at the center of the ejector cap 16 such that both the top surface of the movable supporting plates 11, 13 and the top surface of the ejector cap 16 are substantially on the same plane. Vacuum holes 30 on the top surface or upper platform 17 of the ejector cap 16 provide vacuum suction to hold the dicing film 18 against the upper platform 17 during die detachment. The movable supporting plates 11, 13 are projectable with respect to the upper platform 17 beyond the surface of the upper platform 17.

Adjacent quadrilateral-shaped movable supporting plates 11, 13 are arranged together to form a rectangular or a square combined contact surface 26 and the surface 26 is slightly smaller than the planar surface of the die being detached. The combined contact surface 26 has four edges with each edge positioned corresponding to an edge of the die 14. That is, assuming that X and Y correspond to the width and length of the surface of the die 14, X and Y are greater than the dimensions of the combined contact surface 26 such that there is a gap $\Delta a$ corresponding to the distance between an edge of the die 14 and the corresponding edge of the movable supporting plate unit 12 where the distance $\Delta a$ is in the range of 0.3 mm to 0.8 mm. Preferably, a distance from each side of the combined contact surface 26 to each corresponding side of the die 14 is substantially the same. The required number of movable supporting plates 11, 13 for a given die of 4×4 mm$^2$ can be obtained as follows: Assuming $\Delta a$=0.5 mm, x=1 mm and y=3 mm, then three plates are needed, constituting two outer movable supporting plates 11 and one intermediate movable supporting plate 13.

Figure 5:
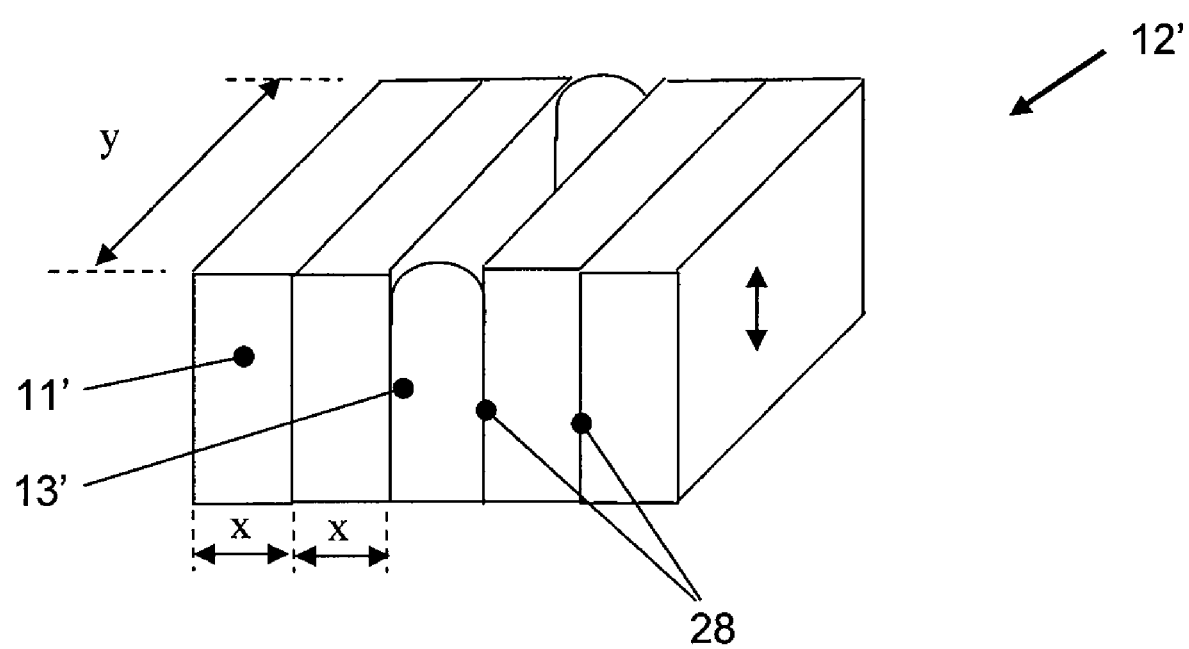
FIG. 5 is an isometric view of a movable supporting plate unit of a die detachment and pick-up tool according to the second preferred embodiment of the invention.

FIG. 5 is an isometric view of a movable supporting plate unit 12' of the die detachment and pick-up tool 10 according to the second preferred embodiment. Outer movable supporting plates 11' and a intermediate movable supporting plate 13' are arranged in contact with each other as with the first preferred embodiment of the movable supporting plate unit 12 described with respect to FIG. 4. There are also an odd number of movable supporting plates 11' and 13' combined together in the arrangement. However, the intermediate movable supporting plate 13' has a curved top supporting surface or contact surface while the outer movable supporting plates 11' have flat top surfaces which are level with one another. Hence, besides the position where the intermediate movable supporting plate 13' is located, the flat geometrical top surfaces of the outer movable supporting plates 11' form a continuous combined contact surface 26 on each side of the intermediate movable supporting plate 13' since there are no gaps between adjacent movable supporting plates 11'. Each movable supporting plate 11' and the intermediate movable supporting plate 13' have the same x, y dimensions as the movable supporting plates 11, 13 of the first preferred embodiment, having a width x and a length y where x is in the range of 0.8 mm to 1.2 mm and y is 0.6 mm to 1.6 mm less than a length of a die 14. The length y of the movable supporting plates 11, 13 is 0.6 mm to 1.6 mm less than a length Y of the die 14, such that the distance $\Delta a$ is correspondingly in the range of 0.3 mm to 0.8 mm.

The second preferred embodiment of the movable supporting plates 11', 13' is useful when the dicing film 18 is of a non-ultraviolet ("non-UV") type. Non-UV dicing film 18 is sticky even when most of the die has been detached from the surface of the film 18 during die detachment. Thus, it is useful to have the intermediate movable supporting plate 13' designed with a radius or a curvature in order to reduce the area of contact between the dicing film 18 and the movable supporting plate 13' for easy removal of the die 14.

Figure 6A:
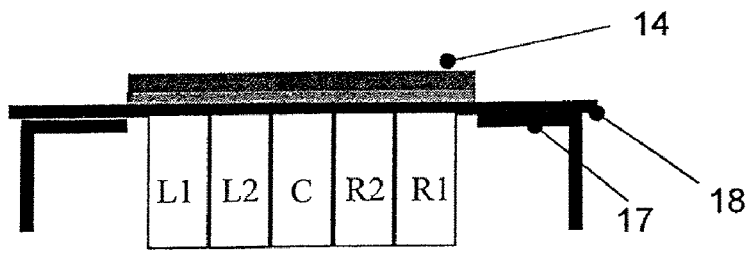
FIGS. 6A to 6H illustrate a pick up sequence for a die from an adhesive dicing film using a first method of delaminating the die with the die detachment and pick-up tool according to the first preferred embodiment of the invention.
Figure 6B:
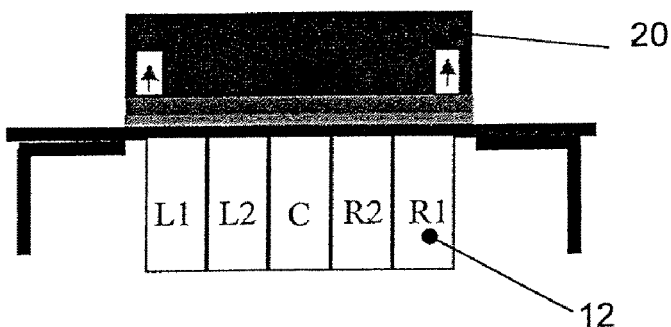
Figure 6C:
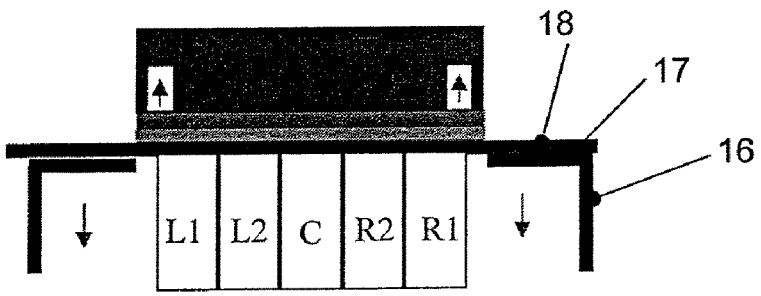

FIGS. 6A to 6H illustrate a pick up sequence for a die 14 from an adhesive dicing film 18 using a first method of delaminating the die 14 with the die detachment and pick-up tool 10 according to the first preferred embodiment of the invention. Utilizing this first method, the combined contact surface 26 which is supporting the dicing film 18 holding the die 14 will be operative to delaminate the die by moving the outer movable supporting plates 11 away from the die 14 before the intermediate movable supporting plate 13 moves away from the die 14. In FIG. 6A, five movable supporting plates L1, L2, C, R1, R2 are used. The top surfaces of the five movable supporting plates are initially in the same plane as the upper platform 17 of the ejector cap 16. A die 14 in the wafer to be detached is aligned and moved to the center of the ejector cap 16. FIG. 6B shows the collet 20 being positioned above the top surface of the die 14. Vacuum suction is applied on the die 14 via the collet 20 in order to hold the die 14 in position during detachment of the die 14. At the same time, vacuum suction is applied to the ejector cap 16 in order to hold the dicing film 18 against the upper platform 17 of the ejector cap 16 as shown in FIG. 6C.

Figure 6D:
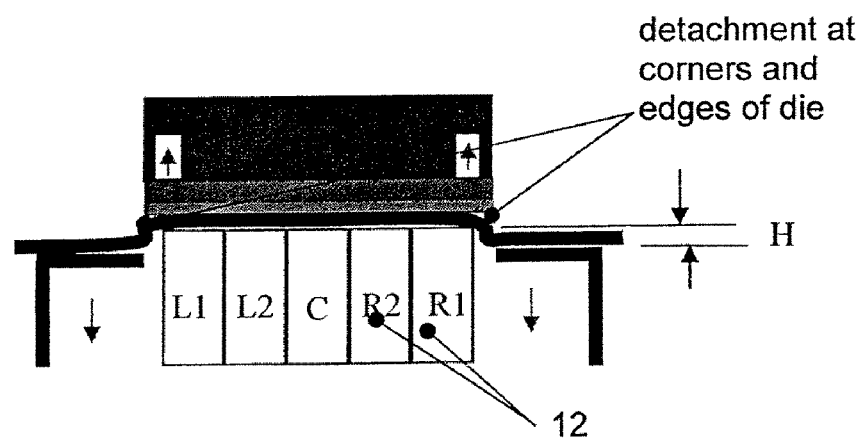

The movable supporting plates L1, L2, C, R1, R2 move up a distance H above the upper platform 17 of the ejector cap 16 in FIG. 6D. Peeling energy is applied firstly to the edges and corners of the die 14. The magnitude of the peeling energy depends on the strength of the vacuum suction and the projected distance H of the five movable supporting plates. As the vacuum suction is usually kept constant through the detachment process, the magnitude of the peeling energy is dependent on the projected distance H moved by the five movable supporting plates. The edge and the corner areas of the die 14 will be detached first during the detachment process since the top surface of the movable supporting plates 12 is smaller than the surface of the die 14.

Figure 6E:
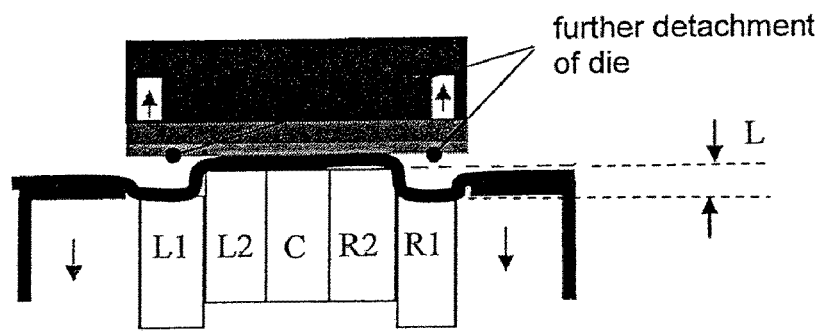
Figure 6F:
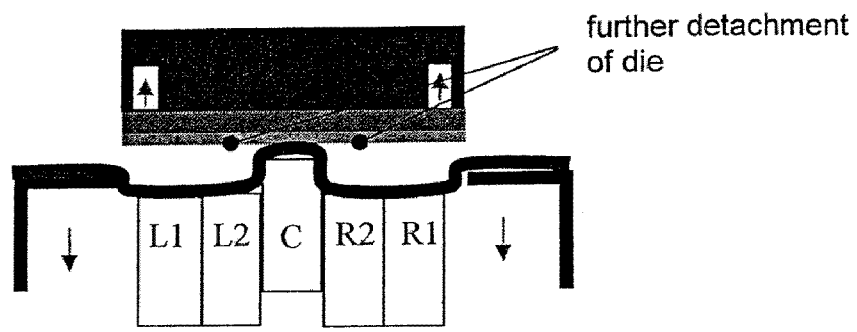
Figure 6G:
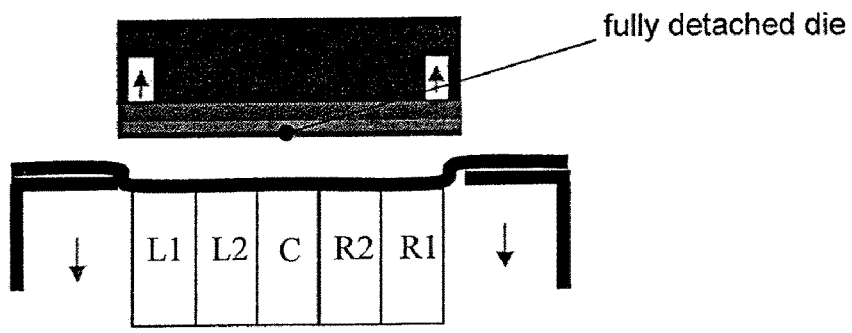
Figure 6H:
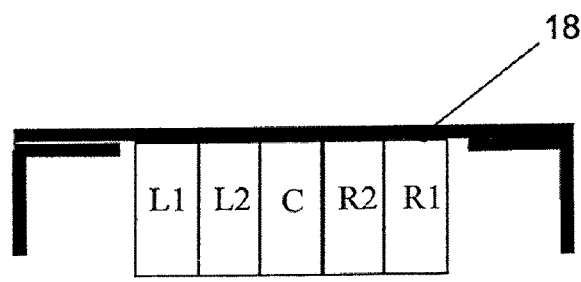

After the delamination of the dicing film 18 over the edges and corner of the die 14, the movable supporting plates L1, R1 located at opposite ends of the movable supporting plate unit 12 are moved down by a distance L to the same stipulated level below the upper platform 17 of the ejector cap 16 so that the dicing film 18 would be further detached from both ends of the die 14 by a distance corresponding to the distance L moved down by the movable supporting plates L1, R1 as shown in FIG. 6E. Next, another two movable supporting plates L2, R2 move down by the distance L in sequential order before the intermediate movable supporting plate C is moved down by the same distance as shown in FIGS. 6F and 6G. Finally, the dicing film 18 would be completely detached from the die 14 before the die 14 is lifted by the collet 20 and transferred to a bonding position as in FIG. 6G. In FIG. 6H, the movable supporting plates L1, L2, C, R2, R1 are returned to their initial levels before detachment commences for the next die. All the plates are now of uniform height forming a continuous combined contact surface 26 in contact with the dicing film 18.

Figure 7E:
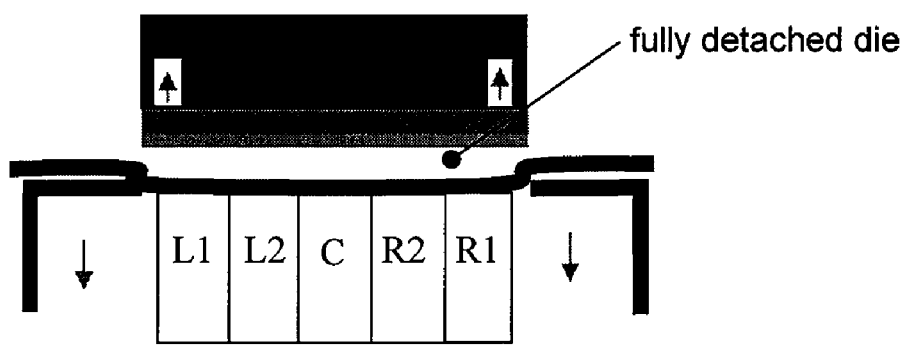

FIGS. 7A to 7F illustrate a second method of delaminating a die 14 with the die detachment and pick-up tool 10. Utilising this second method, the combined contact surface 26 which is supporting the die 14 is operative to delaminate the die 14 by moving adjacent movable supporting plates 11, 13 away from the die 14 consecutively from one side of the combined contact surface 26 to an opposite side of the combined contact surface 26. The movable supporting plates L1, L2, C, R1, R2 move up a distance H above the upper platform 17 of the ejector cap 16 so that peeling energy is first applied to the edges and corners of the die 14. After the delamination of the dicing film 18 over the edges and corners of the die 14, the outer movable supporting plate L1 located at one end of the movable supporting plate unit 12 is moved down by a distance L to the stipulated level below the upper platform 17 of the ejector cap 16 as shown in FIG. 7A. Thus, the dicing film 18 above the outer movable supporting plate L1 would be further detached from a corresponding edge of the die 14, and pulled downwards by a distance corresponding to the distance L moved down by the movable supporting plate L1.

Figure 7F:
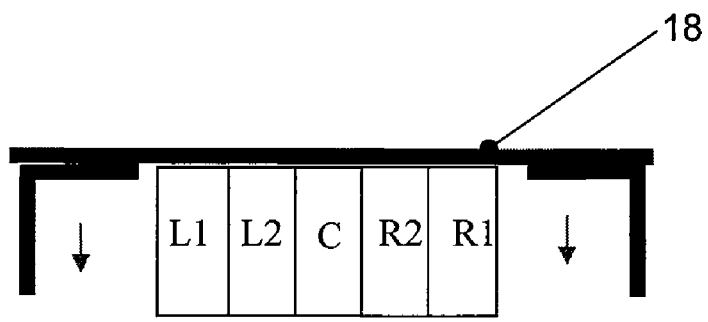

Next, the adjacent outer movable supporting plate L2 inside of L1 moves down by the distance L before the intermediate movable supporting plate C is moved down by the same distance as shown in FIGS. 7B and 7C. The dicing film 18 is further detached when the outer movable supporting plate R2 moves down by distance L as shown in FIG. 7D. Finally, the movable supporting plate R1 moves down by distance L as shown in FIG. 7E such that the dicing film 18 would be completely detached from the die 14 before the die 14 is lifted by the collet 20 and transferred to a bonding position. In FIG. 7F, the movable supporting plates L1, L2, C, R2, R1 are returned to their initial levels before detachment commences for the next die. All the plates are now of uniform height forming a continuous combined contact surface 26 in contact with the dicing film 18.

It should be appreciated that the die detachment and pick-up tool 10 using the movable supporting plate unit 12, 12' in accordance with the preferred embodiments of the invention reduces deformation of the die 14 as compared to the use of ejector pins to detach the die 14 from the adhesive dicing film 18, since localized stress due to pinching effect on the die 14 is minimized. Peeling energy is also increased since there is maximum contact of the movable supporting plates 11, 13 with the dicing film 18 on which the die 14 adheres. Further, having an intermediate movable supporting plate with a curved top surface according to the second preferred embodiment of the invention while the outer plates are flat permits minimal contact of a substantially detached die with a sticky dicing film.

The invention described herein is susceptible to variations, modifications and/or additions other than those specifically described and it is to be understood that the invention includes all such variations, modifications and/or additions which fall within the spirit and scope of the above description.

The invention claimed is:

1. Die detachment device for delaminating a die which is mounted at a position on an adhesive film, comprising:
   a plurality of movable plates arranged adjacent to one another in a row, none of the movable plates enclosing another movable plate, the movable plates further comprising an intermediate movable plate and outer movable plates on opposite sides of the intermediate movable plate;
   wherein the intermediate movable plate comprises a curved contact surface which protrudes towards the die and the outer movable plates comprise relatively flat quadrilateral-shaped contact surfaces for supporting the adhesive film; and
   wherein the contact surfaces of the movable plates together form a combined contact surface for supporting the adhesive film at the position of the die, each movable plate being individually controlled by a motor and movable relative to the other movable plates towards and away from the die.

2. Die detachment device as claimed in claim 1, wherein the combined contact surface comprises a continuous flat surface for supporting the adhesive film at the position of the die.

3. Die detachment device as claimed in claim 1, wherein each movable plate is of substantially the same dimensions as the other movable plates.

4. Die detachment device as claimed in claim 1, wherein there are an equal number of outer plates on the opposite sides of the intermediate movable plate.

5. Die detachment device as claimed in claim 1, wherein a surface area of the combined contact surface is slightly smaller than a planar surface area of the die.

6. Die detachment device as claimed in claim 1, wherein a distance between each side of the combined contact surface to each corresponding side of the die is substantially the same.

7. Die detachment device as claimed in claim 1, wherein a length of each movable plate is between 0.6 mm to 1.6 mm less than a length of the die.

8. Die detachment device as claimed in claim 1, wherein the distance between each side of the combined contact surface to each corresponding side of the die is in the range of 0.3 mm to 0.8 mm.

9. Die detachment device as claimed in claim 1, wherein the die detachment device comprises an odd number of movable plates.

10. Die detachment device as claimed in claim 1, wherein the outer movable plates comprise two pairs of movable plates.

11. Die detachment device as claimed in claim 1, wherein each movable plate is movable independently of the other movable plates.

12. Die detachment device as claimed in claim 1, wherein when the combined contact surface is supporting the adhesive film, the outer movable plates are operative to move away from the die before the intermediate movable supporting plate moves away from the die for delaminating the die.

13. Die detachment device as claimed in claim 1, wherein when the combined contact surface is supporting the adhesive film, the adjacent movable plates are operative to move away from the die consecutively from one side of the combined contact surface to an opposite side of the combined contact surface.

14. Die detachment device as claimed in claim 1, wherein the movable plates are arranged close together such that there are substantially no gaps between adjacent movable plates.

15. Die detachment device as claimed in claim 1, further comprising an ejector cap, wherein the movable plates are centrally located in the ejector cap and are projectable with respect to a platform of the ejector cap, the platform further including vacuum holes on its surface to provide vacuum suction to hold the adhesive film against the platform during die detachment.

16. Die attachment device for delaminating a die which is mounted at a position on an adhesive film, comprising:
   a plurality of movable plates, each of the movable plates having a planar quadrilateral-shaped contact surface, the movable plates being arranged adjacent to one another, the movable plates further comprising an intermediate movable plate and outer movable plates on opposite sides of the intermediate movable plate;

wherein the contact surfaces of the movable plates together form a combined contact surface for supporting the adhesive film at the position of the die, each movable plate being movable relative to the other movable plates towards and away from the die.

* * * * *